United States Patent [19]
Wetzold

[11] 3,992,197
[45] Nov. 16, 1976

[54] SILVER CRYSTALS AND PRODUCTION THEREOF

[76] Inventor: Paul W. Wetzold, 1 Colonial Court, Armonk, N.Y. 10504

[22] Filed: Mar. 18, 1975

[21] Appl. No.: 559,532

[52] U.S. Cl. .............................. 75/118 R; 75/.5 A; 75/108
[51] Int. Cl.² ........................................ C22B 11/04
[58] Field of Search .................. 75/118 R, .5 A, 108

[56] References Cited
UNITED STATES PATENTS

| | | | |
|---|---|---|---|
| 2,752,237 | 6/1956 | Short et al. ............................. | 75/118 |
| 2,753,257 | 7/1956 | Nashner et al. ....................... | 75/118 X |
| 3,201,223 | 8/1965 | Cuhra et al. ........................... | 75/.5 A |
| 3,816,097 | 6/1974 | Daiga ..................................... | 75/.5 A |
| 3,869,280 | 3/1975 | Langlois ................................ | 75/.5 A |

*Primary Examiner*—G. Ozaki
*Attorney, Agent, or Firm*—Dressler, Goldsmith, Clement & Gordon, Ltd.

[57] ABSTRACT

Thin flat hexagonal silver crystals are formed by rapidly mixing at a temperature of 30°–80° C., a water solution of inorganic silver salt containing a chelating agent for ferric iron with a water solution of ferrous sulfate containing sulfuric acid and additional chelating agent. The preferred chelating agent is phosphoric acid, and the crystals which are formed are stabilized by the addition of a protective colloid such as polyvinyl alcohol.

8 Claims, No Drawings

SILVER CRYSTALS AND PRODUCTION THEREOF

The present invention relates to the production of silver in the form of thin flat hexagonal crystals of relatively uniform size. These crystals are highly light reflective, and are useful in cosmetics, nail polishes, and decorative coatings.

In accordance with this invention, a soluble inorganic silver salt is dissolved in water in the presence of a chelating agent for ferric iron and this solution is added rapidly to a solution of ferrous sulfate in sulfuric acid containing additional ferric chelating agent. The silver is reduced, and as the ferric ion is generated, it is removed from the system by the chelating agent. A protective colloid capable of withstanding the highly acid environment is promptly added to prevent the formation of a spongy or coagulated mass.

The reaction is carried out at a temperature in the range of 30°–80° C. and the ferrous sulfate solution is desirably seeded with nuclei, as by adding a little of the silver solution first, to maximize the uniformity of the crystals which are formed.

Referring first to the silver solution, and while any soluble inorganic silver salt which does not carry interfering anions, such as chloride ions, may be used, silver nitrate will illustrate the class, and is normally used. A small amount of nitric acid is desirably present in the silver solution to maintain it. Thus, using phosphoric acid, which is the preferred ferric chelating agent, a little nitric acid prevents formation of any silver phosphate.

Various chelating agents having a preference for capturing the ferric ion are available such as E.D.T.A., but phosphoric acid is particularly useful herein since it is inorganic and well adapted to function in the low pH mixture which are here involved.

The aqueous silver solution is relatively dilute (1-50 grams per 1000 ml) and since chloride ions can interfere, distilled water is preferred, though deionized water is useful.

It does not take much phosphoric acid to chelate the ferric ion, from 1-50 ml of phosphoric acid per 1000 ml of water being appropriate.

The ferrous sulfate solution contains some additional ferric chelating agent to insure that the ferric ion generated will not interfere. In this solution, the ferrous ion in the active reducing agent and sulfuric acid provides the reactive environment. Again, the solution is dilute and distilled or deionized water is used. Based on 1000 ml of water, from 5-100, preferably from 10-50 grams of ferrous sulfate (measured as the heptahydrate in which form it is conveniently supplied) are appropriately used. The sulfuric acid may conveniently range from 20-200 ml, preferably 40-100 ml, per 1000 ml of water. The chelating agent (usually phosporic acid) concentration is conveniently about the same here as in the silver solution, so admixture will not change its concentration.

The silver solution and the ferrous sulfate solution are preferably combined in an approximately equal volumetric ratio but this can vary from 1:3 to 3:1.

These two solutions should have a temperature from 30°–80° C., preferably from 45°–65° C. when they are mixed. At too high a temperature, the silver crystals dissolve. At too low a temperature, the crystals are too small, and are unattractive.

The formation of seed nuclei constitutes preferred practice. The addition of a little bit of the silver solution into the ferrous sulfate solution will provide these in a few minutes (with agitation). Then, the balance of the silver solution is added rapidly with agitation so that all of the crystal growth takes place quickly throughout the solution mixture.

The product is unique. The crystals are quite uniform, flat, and light reflective. The flat surfaces will have an average diameter in the range of 30–70 microns, preferably from 40–60 microns, and the flatness provides excellent light reflection and sparkle, causing them to appear even larger than they measure. The crystals are quite thin, of the order of 1–2 millimicrons, though this measurement is not precise. As a result, very little silver provides a considerable number of crystals, and the light reflectivity of these crystals is high, justifying the use of these crystals for decorative purposes, despite the cost of the silver.

The crystal product must be stabilized rapidly after formation, otherwise it will become spongy and agglomerate. This is done by adding a protective colloid, typically polyvinyl alcohol, though gelatin or hydroxy ethyl cellulose will further illustrate the class. The colloid should be added promptly, e.g., within about two minutes.

The crystals are then collected, washed with water and then with organic solvents. Thereafter, the crystals will be dealt with dependng on the intended use, or simply dried and stored.

The invention is illustrated in the example which follows.

| Solution 1 | |
|---|---|
| 12.5 grams | silver nitrate |
| 0.55 ml | nitric acid, 70% |
| 10.4 ml | phosphoric acid, 98% |
| 1000 ml | distilled water |
| Solution 2 | |
| 26.8 grams | ferrous sulfate heptahydrate |
| 62.4 ml | sulfuric acid, 98% |
| 10.4 ml | phosphoric acid, 98% |
| 1000 ml | water |
| Solution 3 | |
| 20 ml | 5% aqueous polyvinyl alcohol |

Solutions 1 and 2 are heated to 65° C. 1 ml of solution 1 is added to solution 2 with agitation which is continued for about 3 minutes to cause the generation of seed nuclei. The balance of solution 1 is then added to the seeded solution 2 with agitation, addition being quite rapid (a few second for pouring).

The silver crystals form rapidly, and spontaneously, and solution 3 is added promptly to avoid agglomeration (within about two minutes).

After sedimentation, the crystals are collected in a Buechner funnel and washed neutral with distilled water. Then, the water is washed out with ethanol and the ethanol-wet crystals are ready to be used as desired.

It is convenient to incorporate these wet crystals into a nitrocellulose lacquer, or they can be mixed with castor or other oil. Also, the ethanol can be removed by vacuum drying to provide the crystals per se in a form applicable to human skin.

Numerous other uses will become evident to those skilled in the art of using metal crystals.

In the example given, the bulk of the crystals are hexagonal, but a few triangular crystals are also present. The average diameter was 50 microns, and the thickness was of the order of 1–2 millimicrons.

The invention is defined in the claims which follows, I claim:

1. A method of producing thin flat crystals of silver comprising rapidly mixing with agitation and at a temperature in the range of 30°–80° C. a water solution of a soluble inorganic silver salt containing a chelating agent for ferric iron with a water solution of ferrous sulfate containing sulfuric acid and additional chelating agent for ferric iron, thereby causing thin flat crystals of silver to form, and promptly stabilizing the crystals which are formed by the addition of a protective colloid.

2. A method as recited in claim 1 in which said chelating agent is phosphoric acid.

3. A method as recited in claim 1 in which said silver salt is silver nitrate.

4. A method as recited in claim 1 in which said silver salt is silver nitrate, said chelating agent is phosphoric acid and a small amount of said silver salt solution is added to said ferrous sulfate solution to cause the production of seed nuceli, whereupon the balance of said silver salt solution is added rapidly to the seeded ferrous sulfate solution.

5. A method as recited in claim 4 in which said nitric acid is added to said silver salt solution to prevent formation of silver phosphate.

6. A method as recited in claim 5 in which said solutions are maintained at a temperature in the range of 45°–65° C.

7. A method as recited in claim 1 in which said protective colloid is polyvinyl alcohol.

8. A method as recited in claim 1 in which silver salt solution contains, per 1000 ml of distilled water, 1-50 grams of silver nitrate and from 1-50 ml of phosphoric acid, said ferrous sulfate solution contains, per 1000 ml of distilled water, from 5-1000 grams of ferrous sulfate (measured as though it were the heptahydrate), from 20-200 ml of sulfuric acid, and from 1-50 ml of phosphoric acid, and the two solutions are combined in a volumetric ratio of from 1:3 to 3:1.

* * * * *

UNITED STATES PATENT OFFICE
CERTIFICATE OF CORRECTION

PATENT NO. : 3,992,197
DATED : November 16, 1976
INVENTOR(S) : Paul W. Wetzold

It is certified that error appears in the above-identified patent and that said Letters Patent are hereby corrected as shown below:

Col. 1, line 38, "mixture" should read --mixtures--

Col. 1, line 57, "phosporic" should read --phosphoric--

Col. 2, line 52, "second" should read --seconds--

Col. 4, line 1 "nuceli" should read --nuclei--

Col. 4, line 17, "5-1000" should read -- 5-100 --

Signed and Sealed this

Twenty-fifth Day of January 1977

[SEAL]

Attest:

RUTH C. MASON
Attesting Officer

C. MARSHALL DANN
Commissioner of Patents and Trademarks